United States Patent [19]

Kuhn-Kuhnenfeld et al.

[11] 4,100,014

[45] Jul. 11, 1978

[54] ETCHING AGENT FOR III/V SEMICONDUCTORS

[75] Inventors: Franz Kuhn-Kuhnenfeld, Burghausen; Dietmar Kirsten, Tann, both of Germany; Marianne Maier, Ostermiething, Austria

[73] Assignee: Wacker-Chemitronic Gesellschaft für Elektronik-Grundstoffe mbH, Burghausen, Germany

[21] Appl. No.: 785,138

[22] Filed: Apr. 6, 1977

[30] Foreign Application Priority Data

Aug. 25, 1976 [DE] Fed. Rep. of Germany ....... 2638302

[51] Int. Cl.$^2$ .......................................... H01L 21/306
[52] U.S. Cl. .................................... 156/647; 156/645; 156/662; 156/903; 252/79.3
[58] Field of Search ............... 252/79.3; 156/647, 645, 156/662, 903, 636; 29/580

[56] References Cited

FOREIGN PATENT DOCUMENTS 989,025  4/1965  United Kingdom ................. 156/662

OTHER PUBLICATIONS

Compound Semiconductors, vol. 1, Preparation of III-V Compounds, Rheinhold, 1963, pp. 445–468, QCI-J82, Etching of the III-V Intermetallic Compounds by J. W. Faust, Jr.

*Primary Examiner*—William A. Powell
*Attorney, Agent, or Firm*—Allison C. Collard

[57] ABSTRACT

An etching agent for III/V semiconductor material consisting of
(a) 1 to 30 percent by weight of hydrofluoric acid,
(b) 2 to 30 percent by weight of hydrogen peroxide,
(c) 1 to 75 percent by weight of sulfuric acid,
(d) 15 to 95 percent by weight of water, wherein the quantities by weight of the individual components are so chosen that they will add up to 100 percent by weight.

14 Claims, No Drawings

ETCHING AGENT FOR III/V SEMICONDUCTORS

The invention relates to an etching agent for the characterization and working of III/V semiconductors, as well as to the removal of disturbed surface layers after mechanical working. It is known that faulty crystal structures, fluctuations in doping agents, and profiles of growth in semiconductor crystals may, for instance, be found by chemical etching of the crystal planes to be examined. Suitable etching agents have long been known for all crystal orientations of gallium arsenide which would be significant for the manufacture of semiconductor devices, as well as for the gallium-rich 111-plane of gallium phosphide. It is true that the known agents require a polishing of the surfaces before etching. As to the 100-plane of gallium phosphide, there is no known etching process giving satisfactory results (compared for etching processes D. J. Stirland and B. W. Straughan, in "A Review of Etching and Defect Characterisation of Gallium Arsenide Substrate Material" Thin Solid Films 31, 139–170 (1976).

Although according to the process of selective photo-etching, dislocations in 100-planes of gallium phosphide can be clearly shown, the process is not suitable for dislocation counting and thereby for the determination of the dislocation density, because no etch pit is formed (compare F. Kuhn-Kuhnenfeld "Selective Photo-etching of Gallium Arsenide", Journal of Electrochemical Society 119, p. 1063 (1972). It is the object of the present invention to provide an etching agent which enables the operator to develop in a simple manner etch pits due to dislocations on III/V semiconductor planes, particularly gallium phosphide planes with 100-orientation.

According to the invention this object can be fulfilled by an etching agent consisting of (a) 1 to 30, preferably 6 – 18% by weight, of hydrofluoric acid;

(b) 2 to 30, preferably 6 to 20% by weight, of hydrogen peroxide;

(c) 1 to 75, preferably 20 to 55% by weight, of sulfuric acid; and (d) 15 to 95, preferably 30 to 55% by weight, of water, wherein the quantities of the individual components are so chosen that they will add up to a total of 100%.

The simplest manner to obtain the etching solutions is by the mixing of aqueous hydrofluoric acid and aqueous $H_2O_2$ of commercially-obtainable concentrations, and subsequent slow stirring of concentrated aqueous sulfuric acid, that is of about 98% by weight, into the mixture.

Etching agents rich in sulfuric acid, having a sulfuric acid content of above 40% by weight, are particularly suitable for the etching of gallium phosphide planes, since they heat up spontaneously to the temperature of about 90° C, favorable for the polishing of gallium phosphide. On the other hand, gallium arsenide planes can be etched satisfactorily with etching agents of comparatively low sulfuric acid contents, below 40% by weight, without additional heating.

An etching agent of the following composition has been found to be particularly well adapted for the development of etch pits due to dislocations on gallium phosphide wafers with 100-orientation or with deviations up to 6°. The agent contains two parts by volume of 40% weight aqueous hydrofluoric acid, two parts by volume of 30% weight aqueous hydrogen peroxide, and three parts by volume of concentrated aqueous sulfuric acid of about 98% by weight. In the preparation, the diluted hydrofluoric acid and the aqueous solution of hydrogen peroxide are mixed, e.g., in a plastic beaker consisting preferably of polytetrafluoroethylene, and the required quantity of concentrated sulfuric acid is added slowly within about 2 to 5 minutes, while stirring. The solution heats up spontaneously to about 90° C. A sawn or lapped gallium phosphide wafer is placed into the vessel without previous polishing, or it may be hung in the etching solution being held by a plastic holding means, preferably of polytetrafluoroethylene. When carrying out this mode of etching, it is important that the solution be always prepared freshly, because it is not stable for any length of time due to the elevated temperature. The wafer is taken out again after 3 to 6 minutes and rinsed with water. After it has been dried, the dislocation density is determined by counting the etch pits under the microscope.

Another composition of etching agent, which is also very suitable, and which has the advantage compared to the above-described solution that it is stable during a period of several days, consists of one part by volume of 40% by weight of hydrofluoric acid, four parts by volume of 30% by weight of aqueous hydrogen peroxide, and one part by volume of concentrated aqueous sulfuric acid of about 98% by weight, the latter being slowly poured into the solution. Since this etching agent contains considerably less sulfuric acid, it has to be heated first to about 80°–100° C, e.g., in a water bath, before being applied to gallium phosphide discs. The sawn or lapped wafer is then preferably hung in a plastic holding device in the etching solution and taken out again after five to ten minutes, rinsed with water, and dried. The etch pits formed in this operation are easily counted under the microscope.

Gallium arsenide wafers are attacked by the etching solution more rapidly, and it is therefore advantageous to etch them at lower temperatures, about 40° – 60° C, and for a shorter time, about 20 – 30 seconds. The etching agent according to the invention may be generally used for etching gallium arsenide and gallium phosphide at temperatures ranging from 15° – 110° C, preferably 40° – 100° C. At these temperatures the etching agent is stable at least for the time required for the etching operation.

Displacement densities can be determined with the etching agent, according to the invention, especially on 100-planes, 111 A-planes, and 111 B-planes of gallium phosphide, and on 111 A-planes of gallium arsenide. It should be noted that the etching agent does not only act by etching the structure, but also has an extraordinary polishing effect, so that the wafers do not have to be polished in advance. The polishing effect is obtained generally on III/V semiconductor material, particularly on all gallium phosphide and arsenide planes. It may therefore be used as removal agent for round rods after they have been ground to circular shape, where the etching results in the removal of the surface layers, disturbed by mechanical treatment which might lead to dislocations that even could penetrate into the interior and cause defects in the structure of the crystals.

The etching agent, according to the invention, is further suitable for preparing structural elements, especially for thin-etching of wafers before scribing and breaking. The etching agents especially in the composition described hereunder in example 5, are extremely useful for the optical orientation of gallium phosphide, since especially characteristic, pyramid-shaped etching pits are formed.

In the following, the invention will be more fully described in a number of examples, but it should be understood that these are given only by way of illustration and not of limitation.

EXAMPLE 1

40 ml of aqueous hydrofluoric acid (40% by weight) and 40 ml of aqueous hydrogen peroxide (30% by weight) are mixed in a teflon beaker. Subsequently, 60 ml of concentrated sulfuric acid (water content 2% by weight) are slowly added while stirring. The solution heats up spontaneously to 90° C. Onto the bottom of the vessel, a sawn gallium phosphide wafer was placed having a 4° deviation from the 100-orientation, and etching was performed for 5 minutes, while lightly stirring. Thereafter, the wafer was taken out, rinsed with water, and dried. Even with the naked eye, it was possible clearly to detect the typical symmetrical distribution of the dislocation etch pits. The square etch-pyramids could easily be counted by a microscope with 500 magnifying power. A dislocation density of 60,000 per cm square was found.

EXAMPLE 2

The procedure was the same as described in Example 1, with the difference that the gallium phosphide wafer to be etched had a 111 A-orientation. After 5 minutes, clearly visible etch pits could be counted, which were, however, of triangular, rounded shape. Under the microscope, a dislocation density of 40 000 per cm square was observed.

Comparison/Example 1

A sawn gallium phosphide wafer with 111 A-orientation was first lapped on both sides with corundum lapping powder (of 10 um in petroleum). The lapping proceeded for about 10 minutes. The wafer was then rinsed in trichloroethylene, methanol and water. Subsequently, the wafer was polished chemically; for that purpose, into a vessel of plastic material, containing 200 ml methanol, chlorine gas was slowly introduced at room temperature. Thereafter, the gallium phosphide wafer was polished and etched in this solution in hanging position for 15 minutes. The dislocation etching proper was then performed for 10 minutes at 80° C with the so-called Billig Etching Agent, consisting of 12 g potassium hydroxide and 8 g potassium hexa-cyanoferrate (III) in 100 ml water. Only then was it possible to count distinct triangular etching pits under the microscope.

Comparison/Example 2

The procedure was the same as in Comparison/Example 1, with the difference that a gallium phosphide wafer with 100-orientation was used. The etching agent did not develop any dislocation etch pits.

EXAMPLE 3

20 ml of aqueous hydrofluoric acid (40% by weight) and 80 ml aqueous hydrogen peroxide (30% by weight) were mixed in a polyethylene beaker. Subsequently, 20 ml concentrated sulfuric acid (water content 2% by weight) were slowly added, while stirring. The solution was then heated to 50° C on a water bath. A sawn gallium phosphide wafer with 111 A-orientation was hung into the solution by means of a polytetrafluoroethylene holding means for 30 seconds. Then, the wafer was taken out, rinsed with water, and dried. The distribution of dislocations on the wafer was easily seen with the naked eye. When counting under the microscope, triangular, rounded etching pits on the 111 A-plane could be very clearly seen. The dislocation density was determined to be 3500 per square centimeter.

EXAMPLE 4

The procedure was the same as in Example 3, with the difference that a 100-oriented gallium arsenide wafer was etched. There were no dislocations found, but the wafer was sufficiently smoothly polished by the etching in order to be dislocation-etched in a potassium hydroxide melt, e.g., according to DT-OS 19 10 742.

Comparison/Example 3

A sawn gallium arsenide wafer (orientation 111 A, that is to say, the gallium-rich side) was mounted to a round quartz plate by means of picein. After cooling, the excess of picein was dissolved by trichloroethylene and rinsed with methanol. There followed a lapping step with corundum lapping powder of 10 um in water on a glass plate. After lapping was complete, the lapping grains were thoroughly rinsed off with water. The quartz plate was placed in a beaker and thereon were poured slowly in succession 20 ml aqueous hydrogen peroxide, 30% by weight, 20 ml water and 60 ml concentrated sulfuric acid (water content 2% by weight), the mixture being stirred. After 10 - 15 minutes, dislocation etch pits could be easily detected and counted under the microscope. The entire procedure took about 25 minutes, compared to one minute, according to Example 3.

EXAMPLE 5

400 ml aqueous hydrofluoric acid (40% by weight) were mixed with 200 ml aqueous hydrogen peroxide (30% by weight) in a beaker of polytetrafluoroethylene (teflon). Thereafter, 200 ml concentrated sulfuric acid (water content 3% by weight) were slowly added while stirring. The solution heated up spontaneously to 70° C. A GaP monocrystal weighing 410 g, grown with a [100]-seed crystal, and having a planar face sawn approximately normal to the growth direction, was placed in the teflon beaker in such a manner that the planar face was exposed to the etching attack. The crystal was taken out after an etching time of 10 minutes, rinsed, and dried, and so placed on a conventional crystal-orientation apparatus, the etched planar face was lying approximately normal to an incident blue ray of light. On the screen of the orientation apparatus, a reflected figure of light in the shape of a blue star having four rays was clearly visible, by means of which the crystal could be precisely oriented ($\pm 1°$) in [100] direction. From the thus-oriented crystal wafers were cut of a thickness of 400 $\mu$ and the mentioned [100] orientation.

From the foregoing description, one skilled in the art can easily ascertain the essential characteristics of this invention, and without departing from the spirit and scope of the invention thereof, can make various changes and modifications of the invention to adapt it to various usages and conditions. Consequently, such changes and modifications are properly, equitable, and intended to be, within the full range of equivalence of the following claims.

What is claimed is:

1. A polishing dislocation etchant for Ga $As_x P_{1-x}$ where $x$ is in the range between 0 and 1 consisting of:
   (a) 1 to 30 percent by weight of hydrofluoric acid;
   (b) 2 to 30 percent by weight of hydrogen peroxide;
   (c) 1 to 75 percent by weight of sulfuric acid;
   (d) 15 to 95 percent by weight of water;
wherein the quantities by weight of the individual components are so chosen that they will add up to 100 percent by weight.

2. The etchant according to claim 1, wherein the content of hydrofluoric acid is 6 – 18% by weight.

3. The etchant according to claim 1, wherein the content of hydrogen peroxide is 6 – 20% by weight.

4. The etchant according to claim 1, wherein the content of sulfuric acid is 20 – 55% by weight.

5. The etchant according to claim 1, wherein the content of water is 30 – 55% by weight.

6. A process of preparing the etchant according to claim 1, wherein the hydrofluoric acid and the hydrogen peroxide are first mixed in aqueous solution, and in a second step concentrated sulfuric acid is slowly added while stirring.

7. The etchant prepared according to claim 6, consisting of a mixture of two parts by volume of 40% weight hydrofluoric acid, two parts by volume of 30% weight hydrogen peroxide, and three parts by volume of concentrated sulfuric acid.

8. The etchant prepared according to claim 6, consisting of a mixture of one part by volume of 40% weight hydrofluoric acid, four parts by volume of 30% weight hydrogen peroxide, and one part by volume of concentrated sulfuric acid.

9. The etchant prepared according to claim 6, consisting of a mixture of two parts by volume of 40% weight hydrofluoric acid, one part by volume of 30 percent weight hydrogen peroxide, and one part by volume of concentrated sulfuric acid.

10. An improved method for producing etch pits to expose dislocations on the surface of Ga $As_x P_{1-x}$ semiconductors, wherein $x$ is in the range between 0 and 1, comprising the step of:
    treating the surface of said semiconductors with a polishing dislocation etchant consisting of
    (a) 1 to 30 percent by weight of hydrofluoric acid;
    (b) 2 to 30 percent by weight of hydrogen peroxide;
    (c) 1 to 75 percent by weight of sulfuric acid;
    (d) 15 to 95 percent by weight of water; wherein the quantities by weight of the individual components are so chosen that they will add up to 100 percent by weight.

11. The method according to claim 10, wherein the content of hydrofluoric acid is 6 – 18% by weight.

12. The method according to claim 10, wherein the contents of hydrogen peroxide is 6 – 20% by weight.

13. The method according to claim 10, wherein the content of sulfuric acid is 20 – 55% by weight.

14. The method according to claim 10, wherein the content of water is 30 – 55% by weight.

* * * * *